(12) United States Patent
Kondo et al.

(10) Patent No.: US 6,395,381 B1
(45) Date of Patent: May 28, 2002

(54) VAPOR DEPOSITION MATERIAL

(75) Inventors: Satoshi Kondo; Yoshitaka Kubota; Yoshinori Harada, all of Kanagawa (JP)

(73) Assignee: Tosoh Corporation, Yamaguchi (JP)

(*) Notice: Subject to any disclaimer, the term of this patent is extended or adjusted under 35 U.S.C. 154(b) by 0 days.

(21) Appl. No.: 09/573,203

(22) Filed: May 19, 2000

(30) Foreign Application Priority Data

May 25, 1999 (JP) .......................................... 11-144897

(51) Int. Cl.$^7$ ................................................ B32B 5/22
(52) U.S. Cl. ................................ 428/317.9; 428/307.3; 428/319.1; 501/103; 427/566; 427/585; 427/590; 427/255.32
(58) Field of Search ........................ 428/307.3, 317.9, 428/319.1; 501/103; 427/566, 585, 596, 255.32

(56) References Cited

U.S. PATENT DOCUMENTS 4,544,607 A  * 10/1985 Kaneno et al. ............. 428/472
5,789,330 A  *  8/1998 Kondo et al. ............... 501/103

FOREIGN PATENT DOCUMENTS

DE          43 02 167 C1    2/1994
EP          0 812 931 A1    12/1997
JP          7-82019       *  3/1995

OTHER PUBLICATIONS

European Search Report.

* cited by examiner

*Primary Examiner*—Blaine Copenheaver
*Assistant Examiner*—Hai Vo
(74) *Attorney, Agent, or Firm*—Sughrue Mion, PLLC

(57) ABSTRACT

Objects of the invention are to provide a novel vapor deposition material for coating from which a thermal barrier coating film excellent in heat resistance and thermal shock resistance can be satisfactorily formed even by the EB-PVD method, and to provide a method of vapor deposition in which the vapor deposition material is used. The vapor deposition material comprises a zirconia sintered body containing a stabilizer, wherein the sintered body has a content of monoclinic crystals of from 25 to 90% and has a maximum thermal expansion ratio not exceeding $6 \times 10^{-3}$ based on room temperature when heated in the temperature range of from room temperature to 1,200° C. This zirconia sintered body preferably has a tapped density of from 3.0 to 5.5 g/cm$^3$, a porosity of from 5 to 50%, and a mode size of pores of from 0.3 to 10 μm, and in the sintered body the volume of pores of from 0.1 to 10 μm preferably accounts for at least 90% of the total pore volume. The vapor deposition method uses this vapor deposition material.

7 Claims, 2 Drawing Sheets

PORE SIZE DISTRIBUTION CURVE

VAPOR DEPOSITION MATERIAL

FIELD OF THE INVENTION

The present invention relates to a vapor deposition material for coating, which is excellent in heat resistance and thermal shock resistance and capable of forming a stabilized melt pool so that vapor deposition can be carried out.

BACKGROUND OF THE INVENTION

Thermal spraying has conventionally been a general method for forming a thermal barrier coating film. However, as a result of a desire for performance improvements in thermal barrier coating films, methods for forming a thermal barrier coating film by physical vapor deposition (hereinafter referred to as PVD methods) have been put to industrial use. Among these, an EB-PVD method using an electron beam has attracted attention, and methods for forming a thermal barrier coating film by the EB-PVD method have been developed, such as that described in *ADVANCED MATERIAL & PROCESS*, Vol. 140, No. 6, No. 12, pp. 18–22(1991).

Such methods for forming a thermal barrier coating film by the EB-PVD method are used mainly for the heat-resistant coating of parts of, e.g. , an aircraft engine. Materials used as this coating material are required to have excellent heat resistance because they are deposited on those areas of parts which come into direct contact with a high-temperature combustion gas. These materials are hence required to have a high melting point and a high purity. Furthermore, these coating materials are desired to have good adhesion to metal parts, not to peel off by heat cycles, not to be corroded by combustion gas components, and to have a low thermal conductivity so as to keep the temperature of the metal parts as low as possible and to thereby enhance the durability thereof; this durability enhancement is the purpose of this coating film. At present, zirconia containing a stabilizer such as yttria is mainly used as a material satisfying these requirements.

This vapor deposition material consisting of stabilizer-containing zirconia, which is used for forming a thermal barrier coating film is subjected to film deposition by the EB-PVD method employing an electron beam capable of evaporating the vapor deposition material with a high energy, since the material has a high melting point and it is necessary to form a vapor deposition film at a high rate.

In this EB-PVD method, the vapor deposition material set in a crucible is abruptly irradiated with an electron beam with a high energy. Upon this EB irradiation, the vapor deposition material breaks due to the thermal shock as long as it is not a molded body having regulated properties. In case where such breakage occurs in the vapor deposition material, there will be a trouble in supplying the vapor deposition material. Consequently, vapor deposition materials which are broken by the electron beam cannot be practically used.

A means for solving the problem of this breakage caused by an electron beam shock has been disclosed which comprise improving the thermal shock resistance of a vapor deposition material by making it porous.

For example, DE 4,302,167 Cl discloses a zirconia sintered body which contains from 0.5 to 25 wt % $Y_2O_3$ and has a density of 3.0 to 4.5 $g/cm^3$ and in which the content of monoclinic crystals is from 5 to 80% and the rest is accounted for by tetragonal or cubic crystal. In the case where zirconia which has not been stabilized is used in producing the sintered body, it undergoes a phase change from tetragonal crystal to monoclinic crystal during the temperature drop in a heat treatment for the vapor deposition material production although it is tetragonal crystal and stable at high temperatures. This phase change is accompanied by microcracking. There is a description in that reference to the effects that the resultant sintered body has improved cracking resistance due to the presence of the microcracks resulting from the presence of those microclinic crystals generated by the heat treatment, and that cracking resistance is improved also by using larger particles which have an average particle diameter of 50 µm or smaller and in which the content of 0.4 µm and larger particles is 90% or higher and that of 1 µm and larger particles is 50% or higher.

However, even when the zirconia sintered body which is inhibited from cracking due to the presence of the microcracks generated by the action of monoclinic crystals or which has improved cracking resistance due to the use of larger particles is used, there are cases where sintering proceeds rapidly upon rapid heating during EB irradiation depending on the mixed or solid-solution state of $Y_2O_3$, serving as a sintering aid, and the zirconia particles and on, the pore size, whereby the sintered body comes not to withstand the stress accompanying the sintering shrinkage and breaks.

JP-A-7-82019 (the terms "JP-A" as used herein means an "unexamined published Japanese patent application") proposes a vapor deposition material for heat-resistant coating which comprises a zirconia-based porous sintered body. This sintered body is produced by mixing zirconia particles having a purity of 99.8% or higher and a particle diameter of from 0.1 to 10 µm with yttria particles having a particle diameter of 1 µm or smaller, granulating the mixed powder into spherical granules at least 70 wt % of which have a particle diameter of from 45 to 300 µm, heat-treating the mixture granules to form zirconia granules which are spherical aggregate particles at least 50% of which have a particle diameter of from 45 to 300 m, and sintering the zirconia granules. This sintered body has a porosity of from 25 to 50%, and the pores having a diameter of from 0.1 to 5.0 µm account for at least 70% of all the pores thereof.

This sintered body has better resistance to cracking caused by EB irradiation than conventional vapor deposition materials. However, since this zirconia sintered body has been produced from large particles having a wide particle size distribution and poor uniformity in shape, the vapor deposition material has an uneven microstructure. This vapor deposition material therefore has problems that it is difficult to form a stabilized melt pool when the vapor deposition material is melted by EB irradiation in conducting vapor deposition, and that increasing the EB output so as to heighten the deposition rate tends to result in melt scattering, etc.

As described above, the known techniques have been insufficient in forming a stabilized melt pool and obtaining a stable evaporation rate by improving thermal shock resistance during EB irradiation and preventing the melt which has been melted by EB irradiation from bumping.

SUMMARY OF THE INVENTION

An object of the invention is to provide a novel vapor deposition material for heat-resistant coating which has been improved in the formation of a stabilized melt pool and stability of evaporation rate by mitigating or eliminating the problems of those conventional vapor deposition materials, i.e., by improving thermal shock resistance during EB irradiation and preventing the melt which has been melted by EB irradiation from bumping. Another object of the invention is to provide a vapor deposition method wherein the vapor deposition material is used.

The present inventors made intensive studies in order to solve such problems. As a result, the invention has been achieved.

The invention provides a novel vapor deposition material for heat-resistant coating which comprises a zirconia sintered body containing a stabilizer, wherein the sintered body has a content of monoclinic crystals of from 25 to 90% and has a maximum thermal expansion ratio not exceeding $6 \times 10^{-3}$ based on room temperature when heated in the temperature range of from room temperature to 1,200° C., and which has been improved in the formation of a stabilized melt pool and stability of evaporation rate by improving thermal shock resistance during EB irradiation and preventing the melt which has been melted by EB irradiation from bumping. The invention further provides a vapor deposition method wherein this vapor deposition material is used.

The invention will be described in detail. The vapor deposition material of the invention comprises a zirconia sintered body containing a stabilizer, and is characterized in that the sintered body has a content of monoclinic crystals of from 25 to 90% and has a maximum thermal expansion ratio not exceeding $6 \times 10^{-3}$ based on room temperature when heated in the temperature range of from room temperature to 1,200° C. This vapor deposition material for. heat-resistant coating is preferably characterized in that the zirconia sintered body has a tapped density of from 3.0 to 5.5 g/cm³, a porosity of from 5 to 50%, and a mode size of pores of from 0.3 to 10 μm and in the sintered body the volume of pores of from 0.1 to 10 μm accounts for at least 90% of the total pore volume.

DETAILED DESCRIPTION OF THE INVENTION

The features of the invention will be explained below in detail.

The main cause of the cracking or breakage of a vapor deposition material by EB irradiation is the stress generated by the thermal expansion accompanying the partial abrupt heating of the vapor deposition material by the EB irradiation. Consequently, a vapor deposition material can be inhibited from cracking or breaking upon EB irradiation by reducing the thermal expansion ratio thereof.

A method effective in regulating the thermal expansion ratio of a vapor deposition material is to utilize a phase transition from monoclinic to tetragonal crystals. Monoclinic crystals change into tetragonal crystals at temperatures of from 500 to 1,200° C. and, as a result of this phase transition, the volume of the zirconia particles decreases by about 4%. The change in expansion ratio with temperature in this case is shown by curve A in FIG. 1.

The temperatures at which the phase transition occurs vary depending on the amount of the stabilizer present as a solid solution in the monoclinic zirconia particles and on the crystal size This volume change due to the phase transition is utilized so that the thermal expansion due to heating is compensated for by the volume shrinkage due to the phase transition, whereby the vapor deposition material can have a reduced apparent thermal expansion ratio and be inhibited from cracking or breaking during EB irradiation. Namely, monoclinic zirconia particles differing in phase transition temperature are used in combination so that the phase transition will occur gradually in a wide temperature range, whereby the expansion caused by heating in this temperature range is compensated for by the volume shrinkage due to the phase transition. As a result the vapor deposition material can have a reduced apparent thermal expansion ratio.

Figure 1:
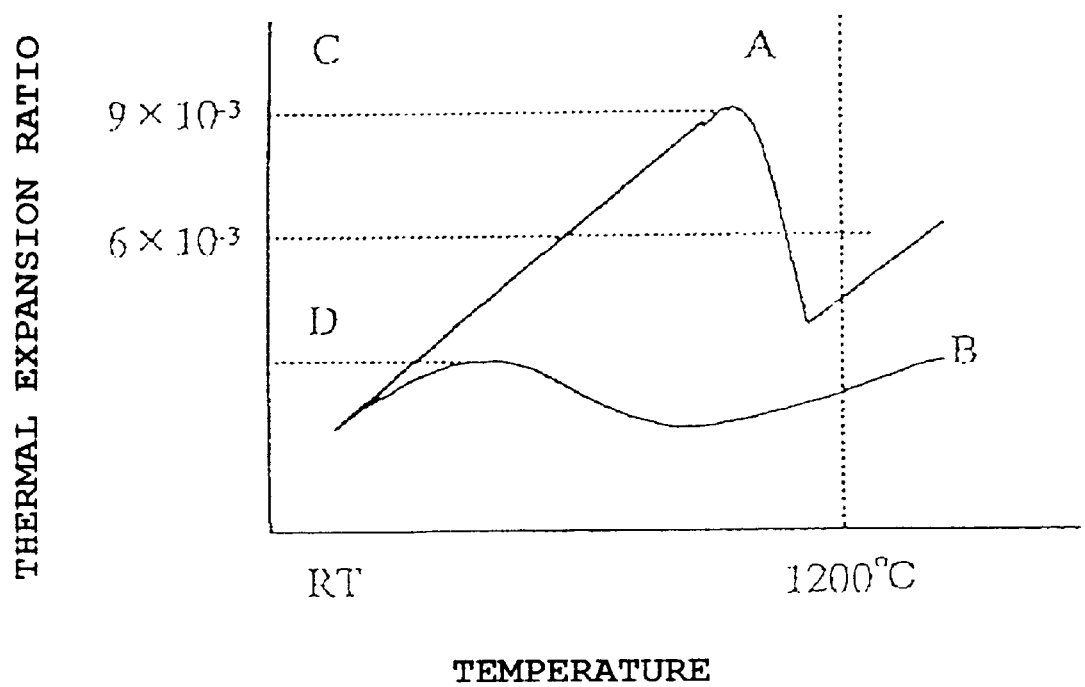
FIG. 1 is a graphic presentation showing thermal expansion curves for a conventional vapor deposition material and a vapor deposition material according to the invention.

The change in expansion ratio of this vapor deposition material with temperature is shown by curve B in FIG. 1.

Specifically, the conventional vapor deposition material, when heated in the temperature range of from room temperature to 1,200° C., has a maximum thermal expansion ratio of about $9 \times 10^{-3}$ (corresponding to C in FIG. 1) based on room temperature, whereas the vapor deposition material obtained above has been regulated so as to have a maximum value of that ratio of $6 \times 10^{-3}$ or smaller (corresponding to D in FIG. 1). As a result, the stress accompanying the thermal expansion caused by EB irradiation heating can be reduced and the vapor deposition material can be prevented from cracking or breaking during EB irradiation. Maximum values of thermal expansion ratio exceeding $6 \times 10^{-3}$ are undesirable in that the stress caused by thermal expansion during EB irradiation is increased and thermal shock resistance is reduced. From the standpoints of inhibiting thermal stress generation and preventing the breakage caused by a thermal shock during EB irradiation, the maximum value of thermal expansion ratio is preferably $3.0 \times 10^{-3}$ or smaller.

Although the stress generation by EB irradiation can be inhibited by reducing the apparent thermal expansion ratio as described above, it is difficult to completely eliminate the thermal expansion accompanying EB irradiation heating. It is therefore necessary to further regulate the vapor deposition material with respect to the crystalline phases and microstructure thereof in order to prevent the vapor deposition material from being broken by a stress generated.

For this purpose, the zirconia sintered body used as a vapor deposition material is characterized by having a content of monoclinic crystals of from 25 to 90%. These monoclinic crystals in the vapor deposition material have generated, through phase transition during cooling to room temperature, from tetragonal crystals, which were present at high temperatures in the heat treatment in producing the vapor deposition material. This phase transition during cooling is accompanied by a volume expansion to generate microcracks around the monoclinic crystals. The sintered body hence has many microcracks generated by the presence of monoclinic crystals. Even when cracking occurs due to a thermal shock, the propagation of these cracks is inhibited by the microcracks and the cracks propagate meanderingly. Thus, the microcracks have the effect of absorbing the breaking energy of a thermal shock and are effective in inhibiting the breakage by a thermal shock. As described above, the presence of monoclinic crystals contributes to an improvement in thermal shock resistance. Vapor deposition materials having a content of monoclinic crystals lower than 25% are hence undesirable in that the microcracks' effect of inhibiting the breakage due to a thermal shock is insufficient because of the too small amount of monoclinic crystals and that the effect of reducing the thermal expansion ratio by utilizing a phase transition from monoclinic to tetragonal crystals is lessened, resulting in impaired thermal shock resistance. Furthermore, contents of monoclinic crystals exceeding 90% are undesirable in that the amount of monoclinic crystals which have been formed through phase transition from tetragonal crystals during cooling after heating in vapor deposition material production is too large and, hence, the vapor deposition material cracks due to a volume change accompanying a phase transition or has considerably reduced strength. The more preferred range of the content of monoclinic crystals is from 40 to 85% from the standpoints of maintaining thermal shock resistance and inhibiting a phase transition occurring during baking from generating cracks.

An described above, the presence of monoclinic crystals results in the generation of many microcracks in the molded body, and these microcracks have the effect of absorbing the energy of a thermal shock. Namely, the presence of monoclinic crystals contributes to an improvement in thermal shock resistance. Even in the case where the thermal expansion due to EB irradiation heating is inhibited from generating a stress by regulating the phase transition temperatures at which monoclinic crystals change into tetragonal crystals, it is difficult to eliminate the apparent thermal expansion and completely prevent stress generation. It is therefore important to utilize the presence of monoclinic crystals to improve thermal shock resistance in order to prevent breakage caused by the stress.

The tapped density of the zirconia sintered body in the invention is preferably from 3.0 to 5.5 g/cm$^3$. Tapped densities thereof exceeding 5.5 g/cm$^3$ are undesirable in that the local heating by EB irradiation results in an enhanced thermal stress to cause breakage. On the other hand, tapped densities thereof lower than 3.0 g/cm$^3$ are undesirable in that such a sintered body has reduced mechanical strength and hence poor handleability.

The zirconia sintered body in this case is characterized in that the porosity thereof is from 5 to 50% and the volume of pores of from 0.1 to 10 $\mu$m accounts for at least 90% of the total pore volume. The proportion of pores of from 0.1 to 10 $\mu$m to the total pore volume is desirably 95% or higher. Porosities thereof lower than 5% are undesirable in that breakage occurs due to the thermal stress caused by local heating during EB irradiation. Conversely, porosities thereof exceeding 50% are undesirable in that such a sintered body has reduced mechanical strength and hence poor handleability. Furthermore, in case where the proportion of pores having a diameter of from 0.1 to 10 $\mu$m is lower than 90%, this sintered body is undesirable because it has insufficient thermal shock resistance.

The invention further provides a method for forming a thin zirconia film on a substrate of, e.g., a metal or ceramic using the vapor deposition material of the invention by means of an EB vapor deposition apparatus. The invention furthermore provides a metallic or another part obtained by this method.

The invention will be further described below by reference to a general process for producing the vapor deposition material.

A zirconia powder as a starting material is mixed with a stabilizer in a given proportion. This mixture is treated with a mixing apparatus such as a ball mill or Henschel mixer to disperse and mix the ingredients by a wet process using water or an organic solvent, e.g., ethanol, or by a dry process. The starting material powder used desirably has such a high purity that the total content of impurities contained therein excluding hafnium oxide is 0.3 wt % or lower, preferably 0.15 wt % or lower. It is further desirable that among the impurities, the content of $SiO_2$ be lower than 0.3 wt %, that of MgO, CaO, and $TiO_2$ be lower than 0.2 wt %, and that of $Fe_2O_3$ and $Al_2O_3$ be lower than 0.1 wt %. Too large impurity amounts are undesirable in that the vapor deposition material gives a film reduced in heat insulating properties and durability. With respect to BET surface area and particle diameter, each of the zirconia powder and stabilizer used may be a single powder or a mixture of two or more powders differing in either or both of these properties, from the standpoint of regulating the phase transition temperatures at which monoclinic crystals change into tetragonal crystals when the vapor deposition material is heated. In the case where zirconia particles are used in combination with yttria particles, it is possible to produce a burned vapor deposition material in which the zirconia particles differ in the solid-solution state of the stabilizer therein and hence have a range of the amount of the stabilizer in solid solution, and which therefore has a range of phase transition temperature. Consequently, powders varying in those properties can be used in combination. For example, when a zirconia powder having a BET surface area of 25 m$^2$/g, an average primary-particle diameter as small as 6 $\mu$m. and a large secondary-particle diameter is used in combination with an yttria powder having a BET surface area of 3.5 m$^2$/g and an average particle diameter of 2.5 $\mu$m, then a vapor deposition material having desired thermal expansion characteristics can be produced. Furthermore, when a mixture of a zirconia powder having a BET surface area of 0.7: m$^2$/g and an average particle diameter of 6 $\mu$m and a zirconia powder having a BET surface area of 30 m$^2$/g and an average particle diameter of 2 $\mu$m is used in combination with yttria having a BET surface area of 3.2 m$^2$/g and an average particle diameter of 2 $\mu$m, then the difference in reactivity with the yttria between the zirconia powders due to the difference in particle diameter therebetween can be utilized to obtain different solid-solution states of yttria and thereby impart a reduced thermal expansion ratio.

Examples of the stabilizer used in the invention include yttrium oxide, scandium oxide, magnesium oxide, calcium oxide, and oxides of the rare earth elements in group IIIB, the sixth period of the periodic table (i.e., lanthanum, cerium, praseodymium, neodymium, promethium, samarium, europium, gadolinium, terbium, dysprosium, holmium, erbium, thulium, ytterbium, and lutetium) These stabilizers may be used alone or in combination of two or more thereof. The stabilizer is added in an amount of from 0.1 to 40 wt % according to the purpose of use thereof.

The slurry obtained through mixing is dried with an ordinary drying apparatus such as, e.g., a spray dryer, vacuum dryer, or filter press. In the case of mixing by a dry process, the resultant mixture is subjected as it is to the subsequent step. In the powder mixture preparation, an organic binder may be added in order to facilitate powder compaction.

The powder which comprises a zirconia powder and a stabilizer and has been prepared for obtaining a molded body according to the invention is usually packed into a rubber mold and compacted by means of a cold isostatic pressing (CIP) apparatus. Although the compaction pressure is not particularly limited in the invention, a pressure of 100 MPa is generally used.

The compact thus obtained is usually subjected to a heat treatment. In this heat treatment, the compact is burned preferably at 1,100° C. or higher, more preferably at 1,300° C. or higher. In the case where the burning temperature in vapor deposition material production is low and the resultant vapor deposition material undergoes sintering and considerable shrinkage upon heating during EB irradiation, this vapor deposition material is apt to crack because the shrinkage results in the generation of a stress in a larger area. Consequently, this burning is effective in reducing the shrinkage which occurs with the progress of sintering during heating with an electron beam and thus inhibiting cracking.

The zirconia sintered body thus obtained is made up of particles differing in phase transition temperature at which monoclinic crystals change into tetragonal crystals. When this sintered body is heated in the temperature range of from room temperature to 1,200° C., the maximum value of thermal expansion ratio is $6 \times 10^{-3}$ or smaller based on room temperature. Reducing the thermal expansion ratio in that temperature range inhibits the generation of a thermal stress during EB irradiation and is highly effective in improving the cracking resistance of the vapor deposition material during EB irradiation. The maximum value of thermal expansion ratio is desirably $3 \times 10^{-3}$ or smaller.

The zirconia sintered body has a content of monoclinic crystals of from 25 to 90%, preferably from 40 to 85%.

Upon heating, monoclinic crystals change into tetragonal crystals at given temperatures. This phase transition results in a volume decrease of about 4%. This shrinkage due to the phase transition diminishes the thermal expansion of the molded body. Furthermore, the presence of monoclinic crystals has resulted in many microcracks in the molded body, and these microcracks have the effect of absorbing the energy of a thermal shock and inhibiting the progress of cracking during breakage. Thus, the presence of monoclinic crystals contributes to an improvement in thermal shock resistance. In the case where the vapor deposition material scatteringly contains monoclinic crystals in an amount of 30% or larger, these crystals effectively contribute to an improvement in thermal shock resistance. Too high contents of monoclinic crystals are undesirable in that the phase transition results in too large a volume change and thereby causes the vapor deposition material to crack The zirconia sintered body thus obtained preferably has a porosity of from 5 to 50% and a mode size of pores of from 0.3 to 10 μm. In this sintered body, the volume of pores of from 0.1 to 10 μm preferably accounts for at least 90% of the total pore volume. Making the vapor deposition material porous is effective in preventing the breakage caused by the thermal expansion accompanying local heating during EB irradiation. However, porosities thereof lower than 5% are undesirable in that breakage occurs due to a stress resulting from the thermal expansion accompanying local heating during EB irradiation. Porosities thereof exceeding 50% are undesirable in that such a sintered body has reduced mechanical strength and hence poor handleability. Too small pore sizes are undesirable in that such small pores readily disappear during heating by EB irradiation, whereby not only the pores do not effectively function but also sintering is apt to proceed, resulting in reduced thermal shock resistance. In case where the vapor deposition material has too large a pore size, there are problems, for example, that the vapor deposition material has reduced mechanical strength and the stability of the melt pool during vapor deposition is impaired. Consequently, the mode size of pores in the sintered body is preferably from 0.3 to 10 μm, and the volume of pores of from 0.1 to 10 μm preferably accounts for at least 90% of the total pore volume. More preferably, the volume of pores of from 0.1 to 10 μm accounts for at least 95% of the total pore volume. By regulating the sintered body so as to have a structure having pores of such a moderate size, thermal shock resistance is improved.

Properties of starting material powders and conditions for mixing are selected so that the zirconia sintered body for use as a vapor deposition material has properties within the preferred ranges described above. By compacting the mixed powder and burning the compact, a novel vapor deposition material for heat-resistant coating can be produce which has improved thermal shock resistance during EB irradiation and is prevented from bumping after having been melted by EB irradiation, and which therefore has been improved in the formation of a stabilized melt pool and stability of evaporation rate.

The invention further provides a vapor deposition method in which a thin zirconia film is formed on a substrate of, e.g., a metal or ceramic using the vapor deposition material of the invention by means of an EB vapor deposition apparatus.

The invention will be explained below in detail by reference to the following Examples, but the invention should not be construed as being limited by these Examples in any way.

EXAMPLE 1

A slurry prepared by adding 2.5 wt % organic binder to 83.6 g of a zirconia powder having a BET surface area of 25 m$^2$/g and an average particle diameter of 6 μm and 6.4 g of an yttria powder having a BET surface area of 3.5 m$^2$/g and an average particle diameter of 2.5 μm was stirred for 1 hour and then dried.

The powder obtained was packed into a rubber mold (diameter, 35 mm; thickness, 100 mm) and compacted with a wet-system cold isostatic pressing apparatus (4KB×150D× 500L Model, manufactured by Kobe Seiko K. K.) at a pressure of 1 t/cm$^2$. The resultant compact was burned at 1,400° C. to produce a vapor deposition material consisting of a zirconia sintered body having a diameter of 20 mm and a thickness of 6 mm.

EXAMPLE 2

2.5 wt % organic binder was added to 41.8 g of a zirconia powder having a BET surface area of 0.7 m$^2$/g and an average particle diameter of 6 μm, 41.8 g of a zirconia powder having a BET surface area of 30 m$^2$/g and an average particle diameter of 2 μm, and 6.4 g of an yttria powder having a BET surface area of 3.2 m$^2$/g and an average particle diameter of 2 μm. This mixture was stirred for 1 hour and then dried. The powder obtained was packed into a rubber mold (diameter, 35 mm; thickness, 100 mm) and compacted with a wet-system cold isostatic pressing apparatus (4KB×150D×500L Model, manufactured by Kobe Seiko K. K.) at a pressure of 1 t/cm$^2$. The resultant compact was burned at 1,450° C. to produce a vapor deposition material consisting of a zirconia sintered body having a diameter of 20 mm and a thickness of 6 mm.

EXAMPLE 3

2.5 wt % organic binder was added to 41.8 g of a zirconia powder having a BET surface area of 1 m$^2$/g, 41.8 g of a zirconia powder having a BET surface area of 30 m$^2$/g, 3.2 g of an yttria powder having an average particle diameter of 2 μm, and 3.2 g of an yttria powder having an average particle diameter of 0.2 μm. This mixture was stirred for 1 hour and then dried. The powder obtained was packed into a rubber mold (diameter, 35 mm; thickness, 100 mm) and compacted with a wet-system cold isostatic pressing apparatus (4KB×150D×500L Model, manufactured by Kobe Seiko K. K.) at a pressure of 1 t/cm$^2$. The resultant compact was burned at 1,450° C. to produce a vapor deposition material consisting of a zirconia sintered body having a diameter of 20 mm and a thickness of 6 mm.

EXAMPLE 4

2.5 wt % organic binder was added to 27.9 g of a zirconia powder having a BET surface area of 5 m²/g and an average particle diameter of 2 μm, 27.9 g of a zirconia powder having a BET surface area of 0.7 m²/g and an average particle diameter of 6 μm, 27.9 g of a zirconia powder having a BET surface area of 30 m²/g and an average particle diameter of 2 μm, and 6.4 g of an yttria powder having an average particle diameter of 2 μm. This mixture was stirred for 1 hour and then dried. The powder obtained was packed into a rubber mold (diameter, 35 mm; thickness, 100 mm) and compacted with a wet-system cold isostatic pressing apparatus (4KB×150D×500L Model, manufactured by Kobe Seiko K. K.) at a pressure of 1 t/cm². The resultant compact was burned at 1,450° C. to produce a vapor deposition material consisting of a zirconia sintered body having a diameter of 20 mm and a thickness of 6 mm.

COMPARATIVE EXAMPLE 1

To 1,393.6 g of a zirconia powder having an average particle diameter of 5 μm was added 106.4 g of an yttria powder having an average particle diameter of 2 μm. This mixture was mixed by means of a ball mill (capacity, 2.5 liters; balls, 7.5 kg) for 1 hour and then dried. The powder obtained was packed into a rubber mold (diameter, 35 mm; thickness, 100 mm) and compacted with a wet-system cold isostatic pressing apparatus (4KB×150D×500L Model, manufactured by Kobe Seiko K. K.) at a pressure of 1 t/cm². The resultant compact was burned at 1,490° C. to produce a vapor deposition material consisting of a zirconia sintered body having a diameter of 20 mm and a thickness of 6 mm.

COMPARATIVE EXAMPLE 2

5 wt % (10 g) organic binder was added to 83.6 g of a zirconia powder having an average particle diameter of 1.5 μm and 6.4 g of an yttria powder having an average particle diameter of 0.2 μm. This mixture was mixed by means of a ball mill (capacity, 1 liter; balls, 2.5 kg) for 1 hour. The powder obtained was packed into a rubber mold (diameter, 35 mm; thickness, 100 mm) and compacted with a wet-system cold isostatic pressing apparatus (4KB×150D×500L Model, manufactured by Kobe Seiko K. K.) at a pressure of 1 t/cm². The resultant compact was burned at 1,350° C. to produce a vapor deposition material consisting of a zirconia sintered body having a diameter of 20 mm and a thickness of 6 mm.

COMPARATIVE EXAMPLE 3

100 g of a zirconia powder containing 4 mol % of yttria and having an average particle diameter of 0.2 μm solid-solubilized was packed into a rubber mold (diameter, 35 mm; thickness, 100 mm) and compacted with a wet-system cold isostatic pressing apparatus (4KB×150D×500L Model, manufactured by Kobe Seiko K. K.) at a pressure of 1 t/cm². The resultant compact was burned at 1,150° C. to produce a vapor deposition material consisting of a zirconia sintered body having a diameter of 20 mm and a thickness of 6 mm.

COMPARATIVE EXAMPLE 4

A zirconia powder containing 4 mol % of yttria and having an average particle diameter of 0.2 μm solid-solubilized was granulated so as to result in an average particle diameter of 100 μm. These granules were calcined at 1,200° C. Thereafter, 5 g of an organic binder was added to 95 g of the calcined powder. This mixture was pulverized and mixed by means of a ball mill and then dried. The powder obtained was packed into a rubber mold (diameter, 35 mm; thickness, 100 mm) and compacted with a wet-system cold isostatic pressing apparatus (4KB×150D×500L Model, manufactured by Kobe Seiko K. K.) at a pressure of 1 t/cm². The resultant compact was burned at 1,350° C. to produce a vapor deposition material consisting of a zirconia sintered body having a diameter of 20 mm and a thickness of 6 mm.

The vapor deposition materials obtained in Examples 1 to 4 and Comparative Examples 1 to 4 were examined for maximum thermal expansion ratio, tapped density, porosity (%), mode diameter of pores (μm), pore size distribution of 0.1–5 μm pores (%), content of monoclinic crystals (%), and content of tetragonal crystals (%). Furthermore, a 6 mm-square surface part of each vapor deposition material was irradiated with EB at an output of 0.5 kW and then examined for cracks. The results obtained are shown in the following Table 1.

TABLE 1

|  | Example 1 | Example 2 | Example 3 | Example 4 | Comparative Example 1 | Comparative Example 2 | Comparative Example 3 | Comparative Example 4 |
| --- | --- | --- | --- | --- | --- | --- | --- | --- |
| Maximum value of thermal expansion ratio | $2.5 \times 10^{-3}$ | $5.3 \times 10^{-3}$ | $4.4 \times 10^{-3}$ | $4.0 \times 10^{-3}$ | $9.0 \times 10^{-3}$ | $8.2 \times 10^{-3}$ | $8.5 \times 10^{-3}$ | $8.5 \times 10^{-3}$ |
| Content of monoclinic crystals (%) | 33 | 51 | 47 | 46 | 63 | 40 | ≈0 | ≈0 |
| Content of tetragonal crystals (%) | 0 | 0 | 0 | 0 | 0 | 0 | 84 | 83 |
| Tapped density (g/cm³) | 3.6 | 3.9 | 3.7 | 3.8 | 3.8 | 3.5 | 3.6 | 3.7 |
| Porosity (%) | 40 | 35 | 38 | 36 | 37 | 42 | 41 | 39 |
| Mode diameter of pores (μm) | 0.9 | 1.2 | 1.0 | 1.0 | 1.5 | 0.65 | 0.068 | 4.1 |
| Pore size distribution of 0.1–5 μm pores (%) | 97.1 | 96.7 | 98.4 | 98.7 | 98.7 | 97.6 | 0 | 88.2 |
| Results of EB irradiation | Excellent | good | good | good | cracking | breakage | breakage | breakage |

The values of each of the properties of the vapor deposition materials shown in Table 1 were obtained by the following methods.

Tapped Density: The tapped density of each vapor deposition material was calculated from the weight of a cylindrical sample thereof measured with an electronic force balance and its shape sizes determined with a micrometer.

Porosity, Mode Diameter of Pores, and Pore Size Distribution of 0.1–5 μm Pores: These properties were examined with a mercury porosimeter based on mercury porosimetry (Pore Sizer Type MIC-9320, manufactured by Shimadzu Corporation).

In measurements with a mercury porosimeter, found pore volume values are obtained from the relationship between a pressure at which mercury is pressurized and thereby forced into a sample having pores and the integrated volume of the mercury which has thus penetrated. Specifically, the pressure required for mercury to come into pores having a given diameter can be determined with the Washburn equation. Using this equation, the relationship between a pressure for penetration and the integrated volume of the mercury which has penetrated can be determined as the relationship between the pore diameter and the volume of the mercury which has penetrated into pores having a larger diameter than that. This volume of the mercury which has penetrated indicates the volume of the pores larger than that pore diameter.

This relationship between pore diameter and pore volume is usually corrected with the surface tension and contact angle of mercury and with the mercury head and other factors attributable to the measuring apparatus.

Figure 2:
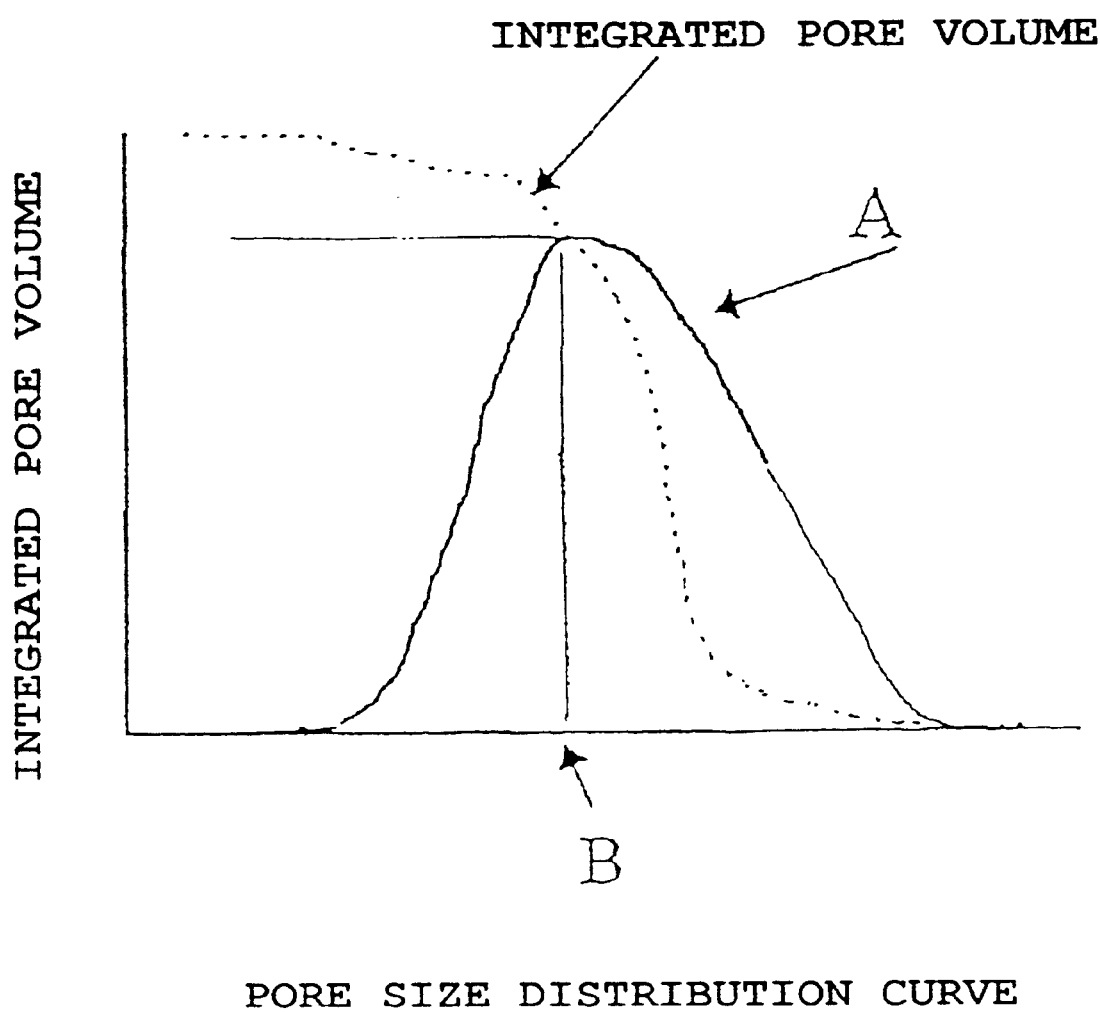
FIG. 2 is a graphic presentation illustrating the relationship between pore diameter and integrated pore volume obtained with a mercury porosimeter.

The values of the following properties are determined from the relationships between pore diameter and integrated pore volume obtained with the mercury porosimeter. The relationship between pore diameter and integrated pore volume is shown by a dotted line in FIG. 2. FIG. 2 shows the meanings of the A and B used in the following explanation on found values.

Porosity (%): [(total pore volume obtained)/(apparent volume of the sample)]×100%

Mode diameter of pores (μm): The pore diameter (B) corresponding to the maximum peak of a curve (A) indicating the rate of change (differential values) of the relationship between pore diameter and integrated pore volume, i.e., a pore size distribution curve (A).

Pore size distribution of 0.1–5 μm pores (%): [(pore volume of 0.1–5 μm pores)/(total pore volume obtained)]× 100%

Content of Monoclinic Crystals and Content of Tetragonal Crystals: Diffraction peaks were obtained with an X-ray diffraction apparatus (Type MXP3VA, manufactured by Macscience K. K.) , and the contents were calculated therefrom using the following equations 1 and 2.

Content of monoclinic crystals =

$$\frac{Im(111) + Im(11\bar{1})}{Im(111) + Im(11\bar{1}) + It, c(111)} \times 100$$

Im(111): integrated intensity for peaks attributable to monoclinic crystals (111)

Im(111): integrated intensity for peaks attributable to monoclinic crystals (111)

It,c (111): sum of the integrated intensities for tetragonal crystals (111) and cubic crystals (111)

Content of tetragonal crystals (%) =

$$[100 - (\text{content of monoclinic crystals } (\%))] \times \frac{3It(400)}{3It(400) + 2Ic(400)}$$

Ic(400): integrated intensity for peaks attributable to cubic crystals (400)

It(400): integrated intensity for peaks attributable to tetragonal crystals (400)

Maximum Value of Thermal Expansion Ratio: Using a TMA (TMA of high-temperature type CN8098F2, manufactured by Rigaku K. K.), each vapor deposition material obtained was heated from room temperature to 1,400° C. at a rate of 200° C./h to obtain a thermal expansion ratio curve. From this curve, the maximum value of thermal expansion ratio in the range of from room temperature to 1,200° C. was determined.

According to the invention, a vapor deposition material for coating is obtained which does not crack even upon EB irradiation. This vapor deposition material is used, for example, for the heat-resistant coating of parts of, e.g., an aircraft engine.

While the invention has been described in detail and with reference to specific embodiments thereof, it will be apparent to one skilled in the art that various changes and modifications can be made therein without departing from the spirit and scope thereof.

What is claimed is:

1. A vapor deposition material comprising a zirconia sintered body containing a stabilizer, wherein the sintered body has a content of monoclinic crystals of from 25 to 90% and has a maximum thermal expansion ratio not exceeding $6 \times 10^{-3}$ based on room temperature when heated in the temperature range of from room temperature to 1,200° C., said monoclinic crystals comprising a combination of monoclinic zirconium crystals differing in phase transition temperature, wherein expansion caused by heating in the temperature range of from room temperature to 1,200° C. is compensated for by volume shrinkage due to a gradual phase transition during the heating.

2. The vapor deposition material as claimed in claim 1, wherein the zirconia sintered body has a tapped density of from 3.0 to 5.5 g/cm$^3$, a porosity of from 5 to 50%, and a mode size of pores of from 0.3 to 10 μm and in the sintered body the volume of pores of from 0.1 to 10 μm accounts for at least 90% of the total pore volume.

3. The vapor deposition material as claimed in claim 2, wherein in the sintered body the volume of pores are from 0.1 to 10 μm accounts for at least 95% of the total pore volume.

4. The vapor deposition material as claimed in claim 1, wherein the maximum thermal expansion ratio is $3.0 \times 10^{-3}$ or less.

5. A vapor deposition method, wherein a vapor deposition material is used, which comprises a zirconia sintered body containing a stabilizer, wherein the sintered body has a content of monoclinic crystals of from 25 to 90% and has a maximum thermal expansion ratio not exceeding $6 \times 10^{-3}$ based on room temperature when heated in the temperature range of from room temperature to 1,200° C. said monoclinic crystals comprising a combination of monoclinic zirconium crystals differing in phase transition temperature, wherein expansion caused by heating in the temperature range of from room temperature to 1200° C. is compensated for by volume shrinkage due to a gradual phase transition during the heating.

6. The vapor deposition method as claimed in claim 5, wherein the zirconia sintered body has a tapped density of from 3.0 to 5.5 g/cm$^3$, a porosity of from 5 to 50%, and a mode size of pores of from 0.3 to 10 μm and in the sintered body the volume of pores of from 0.1 to 10 μm accounts for at least 90% of the total pore volume.

7. The vapor deposition method as claimed in claim 5, which is conducted with electron beam irradiation.

* * * * *